United States Patent [19]
Aoki

[11] Patent Number: 6,114,921
[45] Date of Patent: Sep. 5, 2000

[54] DOUBLE-BALANCED MODULATOR AND QUADRI-PHASE SHIFT KEYING DEVICE

[75] Inventor: Kazuharu Aoki, Fukushima-ken, Japan

[73] Assignee: Alps Electric Co. Ltd., Tokyo, Japan

[21] Appl. No.: 09/133,903

[22] Filed: Aug. 13, 1998

[30] Foreign Application Priority Data

Aug. 19, 1997 [JP] Japan .................................. 9-222694

[51] Int. Cl.$^7$ .................................................. H03C 1/54
[52] U.S. Cl. ........................ 332/103; 332/123; 375/308; 375/296; 455/326; 455/333
[58] Field of Search ..................... 332/103, 123; 455/326, 333; 375/308, 296

[56] References Cited

U.S. PATENT DOCUMENTS 5,448,772  9/1995  Grandfield ........................... 455/353
5,584,066  12/1996  Okanobu ............................. 455/302

FOREIGN PATENT DOCUMENTS 0 697 765 A2  2/1996  European Pat. Off. .
23 64 156 B1  3/1975  Germany .
53-60552  5/1978  Japan .

OTHER PUBLICATIONS

Yamao Y. et al., "Electronics & Communications in Japan, Part II—Electronics", Sep. 1994, pp. 1–11.

*Primary Examiner*—Arnold Kinkead
*Attorney, Agent, or Firm*—Brinks Hofer Gilson & Lione

[57] ABSTRACT

A double-balanced modulator in which the bias voltages do not become different by a buffer amplifier or the like connected to the front stage and a carrier wave is not leaked is provided. This modulator comprises a pair of input terminals 2, 3, a pair of preamplifiers 4 for amplifying balance signals supplied to the input terminals 2 and 3, and a double-balanced differential amplifier 23 to which balance carrier signals are supplied and which further amplifies the balance signals that have been amplified by the pair of preamplifiers 4, wherein capacitors 12 are connected in series between the base of a first transistor 7 and one of the input terminals 2, 3 and between the base of a second transistor 8 and the other one of the input terminals 2, 3, respectively.

5 Claims, 3 Drawing Sheets

DOUBLE-BALANCED MODULATOR AND QUADRI-PHASE SHIFT KEYING DEVICE

BACKGROUND OF THE INVENTION

1. Field of the Invention

The present invention relates to a double-balanced modulator and a quadri-phase shift keying device using the double-balanced modulator.

2. Related Background Art

A conventional quadri-phase shift keying device (QPSK) used in the field of the digital communication will be described with reference to FIG. 4.

The quadri-phase shift keying device is constructed by a first double-balanced modulator 101 and a second double-balanced modulator 131. The first double-balanced modulator 101 is constructed by a first pair of preamplifiers 104 for amplifying first balance signals supplied to a first pair of input terminals 102 and 103 and first and second differential amplifiers 105 and 106 for further amplifying the signals amplified by the first pair of preamplifiers 104.

Similarly, the second double-balanced modulator 131 is constructed by a second pair of preamplifiers 134 for amplifying second balance signals supplied to a second pair of input terminals 132 and 133 and third and fourth differential amplifiers 135 and 136 for further amplifying the signals amplified by the second pair of preamplifiers 134.

The first pair of preamplifiers 104 in the first double-balanced modulator 101 has first and second transistors 107 and 108. Constant current sources 109 and 110 are provided for the emitters of the transistors 107 and 108. The one input terminal 102 and the base of the first transistor 107 are connected. The other input terminal 103 and the base of the second transistor 108 are connected.

The first differential amplifier 105 is constructed by third and fourth transistors 116 and 117 whose emitters are connected to each other. The emitters are also connected to the collector of the first transistor 107. The second differential amplifier 106 is similarly constructed by fifth and sixth transistors 118 and 119 whose emitters are connected to each other. The emitters are also connected to the collector of the second transistor 108. The base of the third transistor 116 and the base of the sixth transistor 119 are connected to each other. The base of the fourth transistor 117 and the base of the fifth transistor 118 are connected to each other. A first balance carrier signal is supplied across the bases.

An output of the first differential amplifier 105 and an output of the second differential amplifier 106 are supplied to a first adder 120. The first adder 120 has: a first load resistor 121 which is commonly used by the collector of the third transistor 116 that is one of the transistors constructing the first differential amplifier 105 and the collector of the fifth transistor 118 that is one of the transistors constructing the second differential amplifier 106; and a second load resistor 122 which is commonly used by the collector of the fourth transistor 117 that is the other one of transistors constructing the first differential amplifier 105 and the collector of the sixth transistor 119 that is the other one of the transistors constructing the second differential amplifier 106. Consequently, a first double-balanced differential amplifier 123 is constructed by the first differential amplifier 105, the second differential amplifier 106, and the first adder 120. A modulated signal (first modulated signal) is generated between the collectors of the third and fifth transistors 116 and 118 and the collectors of the fourth and sixth transistors 117 and 119 which are connected to each other.

On the other hand, the second pair of preamplifiers 134 in the second double-balanced modulator 131 has seventh and eighth transistors 137 and 138. Constant current sources 139 and 140 are provided for the emitters of the transistors 137 and 138, respectively. The one input terminal 132 and the base of the seventh transistor 137 are connected. The other input terminal 133 and the base of the eighth transistor 138 are connected.

The third differential amplifier 135 is constructed by ninth and tenth transistors 146 and 147 whose emitters are connected to each other. The emitters are also connected to the collector of the seventh transistor 137. The fourth differential amplifier 136 is similarly constructed by eleventh and twelfth transistors 148 and 149 whose emitters are connected to each other. The emitters are connected to the collector of the eighth transistor 138. The base of the ninth transistor 146 and the base of the twelfth transistor 149 are connected to each other, the base of the tenth transistor 147 and the base of the eleventh transistor 148 are connected to each other. A second balance carrier signal having the phase different from that of the first balance carrier signal by 90° is inputted across the bases.

An output of the third differential amplifier 135 and an output of the fourth differential amplifier 136 are inputted to a second adder 150. The second adder 150 has: a third load resistor 151 which is commonly used by the collector of the ninth transistor 146 that is one of the transistors constructing the third differential amplifier 135 and the collector of the eleventh transistor 148 that is one of the transistors constructing the fourth differential amplifier 136; and a fourth load resistor 152 commonly used by the collector of the tenth transistor 147 that is the other one of the transistors constructing the third differential amplifier 135 and the collector of the twelfth transistor 149 that is the other one of the transistors constructing the fourth differential amplifier 136. Consequently, a second double-balanced differential amplifier 153 is constructed by the third differential amplifier 135, the fourth differential amplifier 136, and the second adder 150. A modulated signal (second modulated sinal) is generated between the collectors of the ninth and eleventh transistors 146 and 148 and the collectors of the tenth and twelfth transistors 147 and 149 which are connected to each other.

The first balance carrier signal which is inputted to the first double-balanced differential amplifier 123 and the second balance carrier signal which is inputted to the second double-balanced differential amplifier 153 are generated from a balance carrier signal CW from a carrier oscillator (not shown) by a phase shifter 154.

The first and second modulated signals are synthesized and the synthesized signal is generated as a modulated signal generated by the quadri-phase shift keying device.

In the conventional quadri-phase shift keying device, the base of the first transistor 107 and the base of the second transistor 108 which construct the first pair of preamplifiers 104 are directly coupled to the first pair of input terminals 102 and 103, respectively. Consequently, when a buffer amplifier at the front stage for supplying the first balance signal to the first pair of input terminals 102 and 103 is directly connected to the pair of input terminals 102 and 103, the base voltages of the first and second transistors 107 and 108 depend on the bias current of the buffer amplifier. If the bias current is not in a balanced state, therefore, a difference occurs between the base voltage of the first transistor 107 and the base voltage of the second transistor 108 and the balance of the first double-balanced modulator 101 is lost.

The first balance carrier signal is consequently leaked from the first adder 120 and is inputted to a circuit connected at the post stage, thereby causing generation of a disturbance signal.

Similarly, the base of the seventh transistor 137 and the base of the eighth transistor 138 which construct the second pair of preamplifiers 134 are directly connected to the second pair of input terminals 132 and 133. Consequently, when a buffer amplifier at the front stage for supplying the first balance signal to the second pair of input terminals 132 and 133 is directly connected to the pair of input terminals 132 and 133, the base voltages of the seventh and eighth transistors 137 and 138 depend on the bias current of the buffer amplifier. If the bias current is not in a balanced state, therefore, a difference occurs between the base voltage of the seventh transistor 137 and the base voltage of the eighth transistor 138, and the balance of the second double-balanced modulator 131 is lost. The second balance carrier signal is therefore leaked from the second adder 150 and is inputted to a circuit connected at the post stage, thereby causing generation of a disturbance signal.

The conventional quadri-phase shift keying device has a problem such that when the balanced state between the first double-balanced modulator 101 and the second double-balanced modulator 131 is lost, the leak of the balance carrier increases.

SUMMARY OF THE INVENTION

In the double-balanced modulator of the invention, therefore, the bias voltages are prevented from becoming different and the carrier wave is prevented from being leaked. The quadri-phase shift keying device of the invention keeps two double-balanced modulators balanced, thereby reducing the leakage of the balance carrier.

In order to solve the problem, a double-balanced modulator of the invention comprises: a pair of input terminals to which balance signals are supplied; a pair of preamplifiers which has a pair of transistors connected to the input terminals, respectively, and separately amplifies the balance signals by the transistors; and a double-balanced differential amplifier which has third and fourth transistors whose emitters are connected to the collector of one of the transistors of the preamplifier and has fifth and sixth transistors whose emitters are connected to the collector of the other transistor of the preamplifier and in which a balance carrier signal is supplied between the connection point of the bases of the third and sixth transistors and the connection point of the bases of the fourth and fifth transistors. The bases of the transistors of the preamplifier are connected to the input terminals via capacitors, respectively, and are commonly connected to a single bias supply via respective resistors.

According to the double-balanced modulator in the invention, a second resistor is serially connected to each of the capacitors.

The quadri-phase shift keying device of the invention comprises two double-balanced modulators. The bias supply in the double-balanced modulators is a single bias supply commonly used by the double-balanced modulators.

According to the quadri-phase shift keying device of the invention, a variable resistor is interposed between the bases of the pair of transistors constructing the preamplifier in one of the double-balanced modulators.

DETAILED DESCRIPTION OF THE PREFERRED EMBODIMENTS

Figure 1:
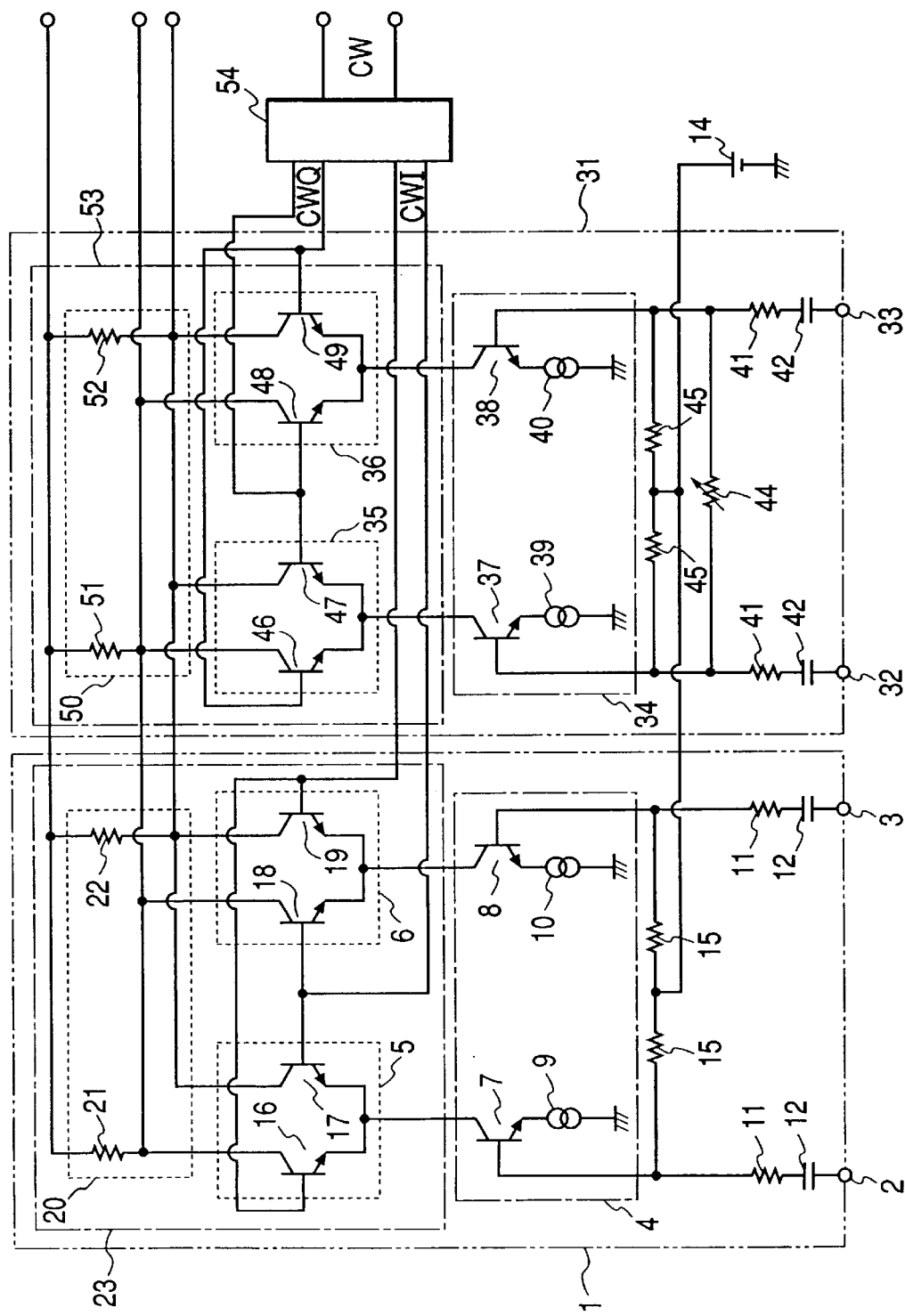
FIG. 1 is a circuit diagram for explaining a double modulator and a quadri-phase shift keying device of the invention.

First, a quadri-phase shift keying device of the invention and a double-balanced modulator of the invention constructing the quadri-phase shift keying device will be described with reference to FIG. 1. In FIG. 1, the quadri-phase shift keying device is constructed by a first double-balanced modulator 1 and a second double-balanced modulator 31. The double-balanced modulator 1 is constructed by: a first pair of preamplifiers 4 for amplifying first balance signals inputted to a first pair of input terminals 2 and 3; and first and second differential amplifiers 5 and 6 for further amplifying the signals amplified by the pair of preamplifiers 4.

Similarly, the double-balanced modulator 31 is constructed by: a second pair of preamplifiers 34 for amplifying second balance signals inputted to a second pair of input terminals 32 and 33; and third and fourth differential amplifiers 35 and 36 for further amplifying the signals amplified by the pair of preamplifiers 34.

The pair of preamplifiers 4 in the double-balanced modulator 1 has first and second transistors 7 and 8, and constant current sources 9 and 10 are provided for the emitters of the transistors 7 and 8. First resistors 11 and first DC blocking capacitors 12 are serially connected between the input terminal 2 and the base of the transistor 7 and between the input terminal 3 and the base of the transistor 8. A DC voltage from a bias supply 14 is applied to the bases of the transistors 7 and 8 via second resistors 15.

The first differential amplifier 5 is constructed by third and fourth transistors 16 and 17 whose emitters are connected to each other. The emitters are also connected to the collector of the transistor 7. The differential amplifier 6 is similarly constructed by fifth and sixth transistors 18 and 19 whose emitters are connected to each other. The emitters are connected to the collector of the transistor 8. The first balance signal amplified by the pair of preamplifiers 4 is supplied across the emitters. The bases of the transistors 16 and 19 are connected to each other, the bases of the transistors 17 and 18 are connected to each other, and a first balance carrier signal CWI is inputted across the bases.

An output of the differential amplifier 5 and an output of the differential amplifier 6 are supplied to a first adder 20. The adder 20 has: a first load resistor 21 commonly used by the collector of the transistor 16 constructing the differential amplifier 5 and the collector of the transistor 18 constructing the differential amplifier 6; and a second load resistor 22 commonly used by the collector of the transistor 17 constructing the differential amplifier 5 and the collector of the transistor 19 constructing the differential amplifier 6. Consequently, a first double-balanced differential amplifier 23 is constructed by the differential amplifiers 5 and 6 and the adder 20. A first modulated signal is generated between the collectors of the transistors 16 and 18 and the collectors of the transistors 17 and 19 which are connected to each other.

On the other hand, the pair of preamplifiers 34 in the double-balanced modulator 31 has seventh and eighth transistors 37 and 38. Constant current sources 39 and 40 are provided for the emitters of the transistors 37 and 38, respectively. Third resistors 41 and second DC blocking capacitors 42 are serially connected between the input terminal 32 and the base of the transistor 37 and between the input terminal 33 and the base of the transistor 38. A variable resistor 44 is interposed between the bases of the transistors 37 and 38. Further, a DC voltage from the bias supply 14 is applied to the bases of the transistor 37 and 38 via fourth resistors 45. The value of the resistor 45 is set to be larger than the value of the resistor 15. Further, the maximum resistance value of the variable resistor 44 is set so that a parallel resistance value of the two resistors 45 which are connected in series between the bases of the transistors 37 and 38 and the maximum resistance value of the variable resistor 44 is larger than the two resistors 15 which are connected in series between the bases of the transistors 7 and 8.

By changing the resistance value of the variable resistor 44, the impedance between the bases of the transistors 37 and 38 is adjusted and the level of the second balance signal which is supplied between the bases of the transistors 37 and 38 can be equalized to the level of the first balance signal which is supplied between the bases of the transistors 7 and 8. Consequently, the double-balanced modulators 1 and 31 can be balanced.

The differential amplifier 35 is constructed by ninth and tenth transistors 46 and 47 whose emitters are connected to each other. The emitters are connected to the collector of the transistor 37. The differential amplifier 36 is similarly constructed by eleventh and twelfth transistors 48 and 49 whose emitters are connected to each other. The emitters are connected to the collector of the transistor 38. The second balance signal amplified by the pair of preamplifiers 34 is inputted across the emitters. The bases of the transistors 46 and 49 are connected to each other, the bases of the transistors 47 and 48 are connected to each other, and a second balanced carrier signal CWQ having the phase different from that of the first balanced carrier signal CWI by 90° is inputted across the bases.

An output of the differential amplifier 35 and an output of the differential amplifier 36 are supplied to a second adder 50. The adder 50 has: a third load resistor 51 commonly used by the collector of the transistor 46 constructing the differential amplifier 35 and the collector of the transistor 48 constructing the differential amplifier 36; and a fourth load resistor 52 commonly used by the collector of the transistor 47 constructing the differential amplifier 35 and the collector of the transistor 49 constructing the differential amplifier 36. Consequently, a second double-balanced differential amplifier 53 is constructed by the differential amplifiers 35 and 36 and the adder 50. A second modulated signal is generated between the collectors of the transistors 46 and 48 and the collectors of the transistors 47 and 49 which are connected to each other.

The first balanced carrier signal CWI supplied to the double-balanced differential amplifier 23 and the second balanced carrier signal CWQ supplied to the double-balanced differential amplifier 53 are generated from the balanced carrier signal CW from a carrier oscillator 66 (refer to FIGS. 2 and 3), which will be described hereinlater, by a phase shifter 54.

The first and second modulated signals are synthesized and the synthesized signal is extracted as a modulated signal generated from the quadri-phase shift keying device.

As mentioned above, in the two double-balanced modulators 1 and 31 constructing the quadri-phase shift keying device of the invention, the pair of input terminals 2 and 3 and the bases of the transistors 7 and 8 constructing the pair of preamplifiers 4 are connected via the resistors 11 and the pair of input terminals 32 and 33 and the bases of the transistors 37 and 38 constructing the pair of preamplifiers 34 are connected via the resistors 41. Consequently, in the double-balanced modulator 1, even when a pair of buffer amplifiers (refer to 65I in FIGS. 2 and 3) at the front stage for sending the first balance signals to the pair of input terminals 2 and 3 are directly connected to the pair of input terminals 2 and 3 and different bias currents are supplied from the pair of buffer amplifiers 65I to the bases of the transistors 7 and 8, the difference between the bias currents flowing in the bases is reduced by the resistors 11. The balancing of the first double-balanced modulator 1 is therefore improved and the first balanced carrier signal leaked from the double-balanced differential amplifier 23 is reduced.

Similarly, in the double-balanced modulator 31 as well, even when a pair of buffer amplifiers 65Q (refer to FIGS. 2 and 3) at the front stage for sending the second balance signals to the pair of input terminals 32 and 33 are directly coupled to the pair of input terminals 32 and 33 and different bias currents are supplied from the pair of buffer amplifiers 65Q to the bases of the transistors 37 and 38, the difference between the bias currents flowing in the bases is reduced by the resistors 41. The balancing of the double-balanced modulator 31 is therefore improved and the second balanced carrier signal leaked from the double-balanced differential amplifier 53 is reduced.

In the double-balanced modulators 1 and 31 of the invention, since the DC bias voltage is applied from the common bias supply 14 to the bases of the transistors 7 and 8 constructing the pair of preamplifiers 4 via the resistors 15 of the same value, substantially the same voltage can be applied to the bases of the transistors 7 and 8. Similarly, since the DC bias voltage is applied from the common bias supply 14 via the resistors 45 of the same value to the bases of the transistors 37 and 38 constructing the pair of preamplifiers 34, substantially the same voltage can be applied to the bases of the transistors 37 and 38.

Since the quadri-phase shift keying device of the invention is constructed by the two double-balanced modulators 1 and 31 as mentioned above, the device has the effects of the double-balanced modulators 1 and 31 as they are. In the quadri-phase shift keying device of the invention, since the variable resistor 44 is provided between the bases of the transistors 37 and 38 constructing the pair of preamplifiers 34 in the double-balanced modulator 31, by changing the resistance value of the variable resistor 44, the balancing of the bias currents of the double-balanced modulators 1 and 31 can be also improved.

A digital communication system using the quadri-phase shifting keying device of the invention, for example, a transmitter of a cellular telephone system of CDMA (code division multiple access) system will be explained with reference to FIG. 2. First, an audio signal from a microphone 61 is inputted to a coding circuit 62. For example, four-bit digital I and Q signals having the relation of crossing arrangement are generated from the coding circuit 62. The I and Q signals serve as the first and second balance signals which are supplied to the double-balanced modulators 1 and 31 in FIG. 1, respectively. The I signal is converted to an analog I signal by the following first D/A converter (digital/analog converter) 63I and the analog I signal is supplied to the first buffer amplifier 65I via a first LPF (low-pass filter) 64I.

Similarly, the digital Q signal is converted to an analog Q signal by a second D/A converter 63Q and the analog Q signal is inputted to the second buffer amplifier 65Q via a second LPF 64Q. The D/A converters 63I and 63Q, the LPFs 64I and 64Q, and the buffer amplifiers 65I and 65Q correspond to a part for processing a so-called a baseband signal and are generally formed in an integrated circuit. The I and Q analog signals are amplified by the buffer amplifiers 65I and 65Q and the amplified signals are inputted to the double-balanced modulators 1 and 31, respectively. The carrier waves CWI and CWQ having the phase difference of 90° obtained from a carrier signal of about 130 MHz from the carrier oscillator 66 by the phase shifter 54 are inputted to the double-balanced modulators 1 and 31. The carrier waves CWI and CWQ are digital phase modulated by the I and Q signals. The double-balanced modulators 1 and 31 therefore construct the quadri-phase shift keying device. A part from the D/A converters 63I and 63Q up to the double-balanced modulators 1 and 31 is constructed by a balance circuit.

An output of the double-balanced modulator 1 and an output of the double-balanced modulator 31 are synthesized by a synthesizing circuit 67, the synthesized signal is inputted to a mixer 69 via a variable gain amplifier 68 and is mixed with a local oscillation signal of about 966 MHz generated from a local oscillator 70, thereby obtaining a transmission signal of about 836 MHz. The transmission signal is transmitted from an antenna 73 via a power amplifier 71 and a band pass filter 72.

Figure 2:
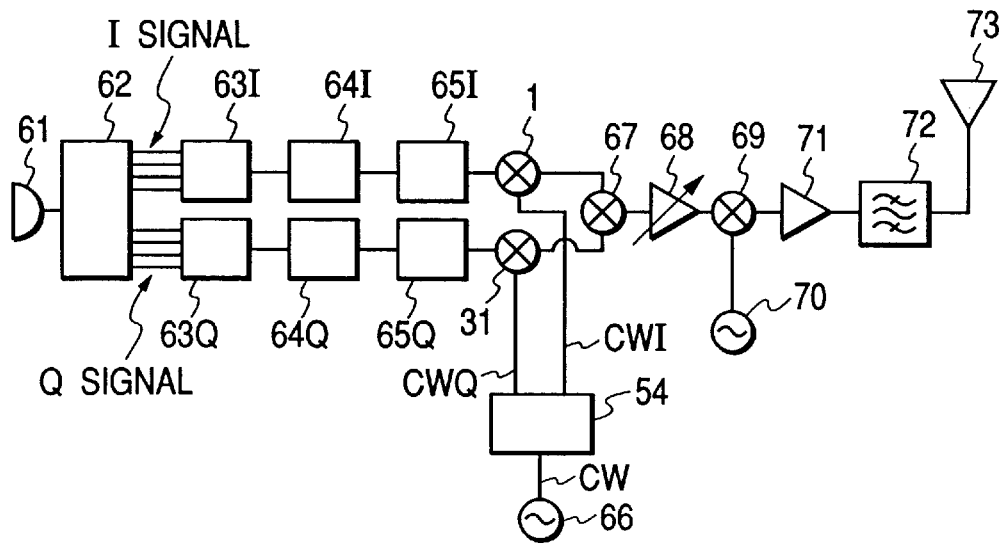
FIG. 2 is a diagram of a transmission circuit of a digital communication system using the quadri-phase shift keying device of the invention.

The synthesizing circuit 67 shown in FIG. 2 does not show the adders 20 and 50 in FIG. 1 but shows a synthesized (connection) part of the outputs of them.

Figure 3:
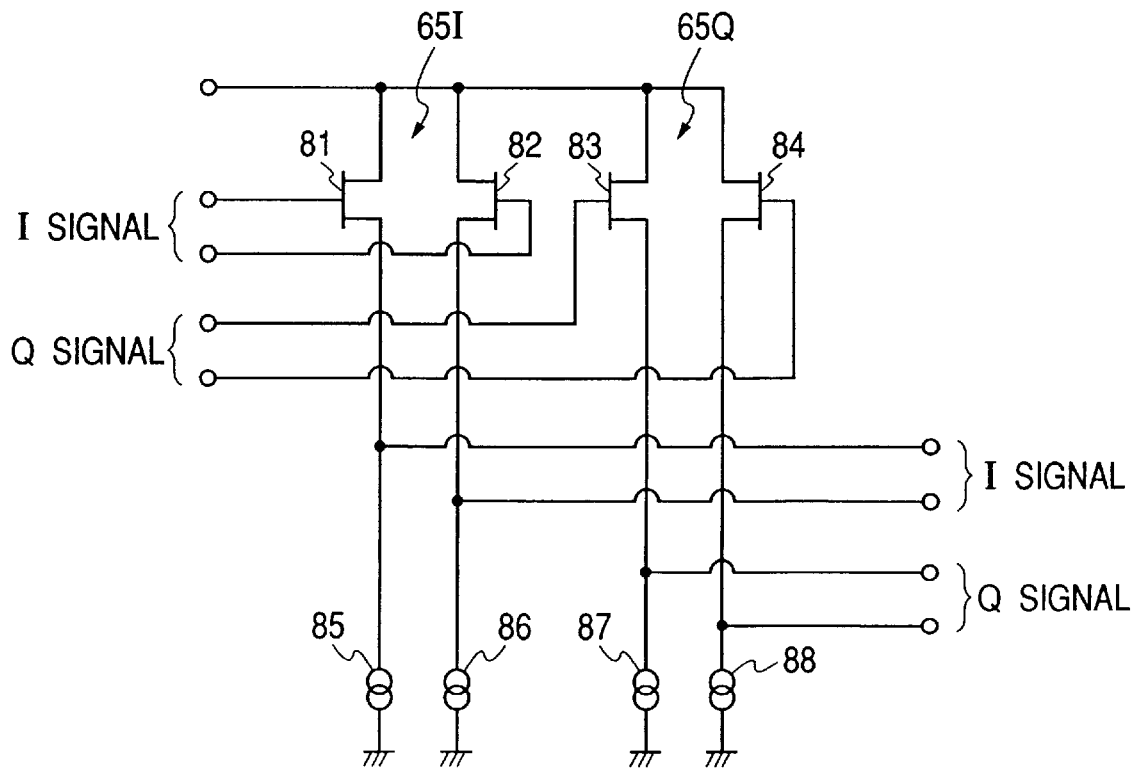
FIG. 3 is a circuit diagram of buffer amplifiers used in the digital communication system of the invention.
Figure 4:
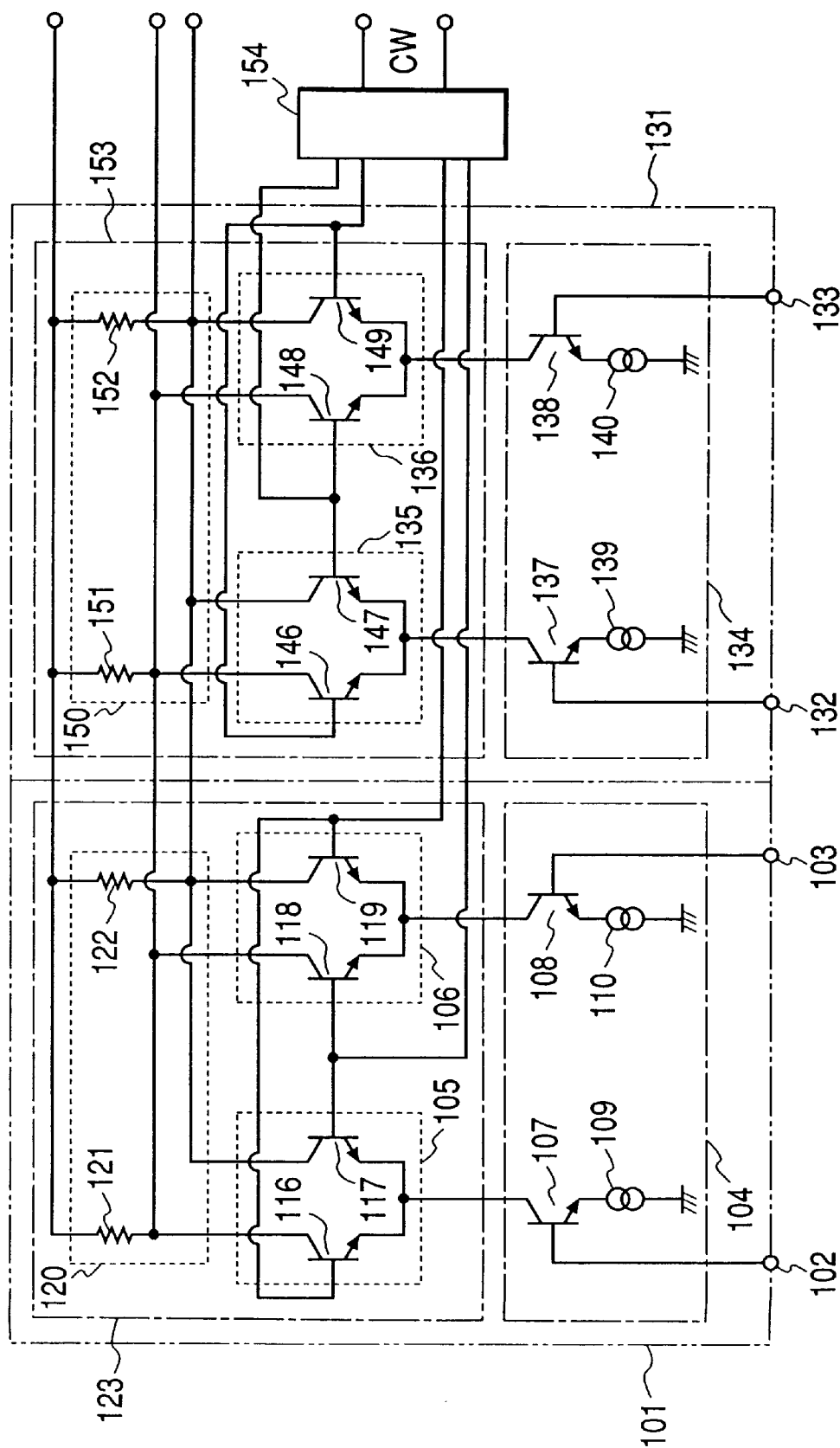
FIG. 4 is a circuit diagram of a conventional quadri-phase shift keying device.

The construction of the buffer amplifiers 65I and 65Q connected at the front stage of the double-balanced modulators 1 and 31 of the invention will be described with reference to FIG. 3. The buffer amplifier 65I is constructed by a pair of FETs 81 and 82. Similarly, the buffer amplifier 65Q is constructed by a pair of FETs 83 and 84. A DC voltage B is supplied to the drains of the FETs 81, 82, 83, and 84 and the sources are connected to constant current sources 85, 86, 87, and 88, respectively.

The I signal (first balance signal) is inputted to the gates of the FETs 81 and 82 and the Q signal (second balance signal) is inputted to the gates of the FETs 83 and 84. The I signal is extracted in a balanced state from between the sources of the FETs 81 and 82 and is inputted to the pair of input terminals 2 and 3 of the double-balanced modulator 1. Similarly, the Q signal is extracted in a balanced state from between the sources of the FETs 83 and 84 and is inputted to the pair of input terminals 32 and 33 of the double-balanced modulator 31. Consequently, the phase of the I signal inputted to one of the pair of input terminals 2 and 3 and the shifted phase of the I signal inputted to the other terminal have the relation of the opposite phases. Similarly, the phase of the Q signal inputted to one of the pair of input terminals 32 and 33 and the shifted phase of the Q signal inputted to the other input terminal have the relation of the opposite phases.

Even when the sources of the FETs 81 and 82 are connected to the pair of input terminals 2 and 3 and the sources of the FETs 83 and 84 are connected to the pair of input terminals 32 and 33, since the quadri-phase shifting keying device has the direct current blocking capacitors 12 and 42, the source voltages of the FETs 81, 82, 83, and 84 are not applied to the bases of the transistors 7, 8, 37, and 38. For example, even if there is a difference between the source voltage of the FET 81 and the source voltage of the FET 82, the base voltages of the transistors 7 and 8 can be set to the same value.

Since unnecessary noises such as the carrier or the like included in the modulated output of the digital communication system can be reduced by the above arrangement, the signal becomes clear and a fine power control can be performed. Especially, it is very effective on maintaining the line in a mobile telephone system of the CDMA (code division multiple access) system.

As mentioned above, according to the double-balanced modulator and the quadri-phase shift keying device of the invention, each of the bases of the pair of transistors of the preamplifier for amplifying the balance signals is connected to each of the input terminals via a capacitors and the bases are commonly connected to the single bias supply via the first resistors. Consequently, the base bias voltages of the transistors of the preamplifier are not influenced by the bias voltages of the buffer amplifiers provided at the front stage of the preamplifier because of the capacitors. Since the same voltage is applied from the single bias supply, the bases are kept at the same bias voltage and the high balancing can be obtained. As a result, the level of the balance carrier signal leaked from each of the double-balanced differential amplifiers can be reduced.

According to the double-balanced modulator and the quadri-phase shift keying device of the invention, since the second resistor is connected in series to each of the capacitors, the voltages of the balance signals applied to the input terminals are decreased to proper voltages by the second and first resistors and then the adjusted signals are applied to the bases of the transistors of the preamplifier. Thus, no distortion occurs in the double-balanced modulator.

In the quadri-phase shift keying device of the invention, since the variable resistor is interposed between the bases of the pair of transistors constructing the preamplifier in one of the double-balanced modulators, the levels of the two balance signals supplied to two double-balanced modulators can be equalized by adjusting the resistance value of the variable resistor. Thus, the balancing of the two double-balanced modulators can be improved.

What is claimed is:

1. A double-balanced modulator comprising:

a first and a second input terminal;

a pair of preamplifiers comprising a first and a second transistor, in which each of the first and the second transistors are interconnected with one of the input terminals, respectively, through at least one capacitor interconnected in series with at least one first resistor;

a double balanced differential amplifier comprising a third and a fourth transistor, in which each of the third and the fourth transistors has a base and an emitter, in which the emitters of the third and the fourth transistors are interconnected to a collector of the first transistor;

said double balanced differential amplifier further comprising a fifth and a sixth transistor, in which each of the fifth and the sixth transistors has a base and an emitter, in which the emitters of the fifth and a sixth transistors are interconnected to a collector of the second transistor; and wherein the bases of the third and sixth transistors and the bases of the fourth and fifth transistors, respectively, are interconnected to receive at least one balance carrier signal, and wherein each of said preamplifiers are interconnected to a single power source through at least one second resistor.

2. The double-balanced modulator of claim 1 wherein each of the first and the second transistors has a base interconnected to the power source.

3. The double-balanced modulator of claim 1 further comprising a second pair of preamplifiers interconnected to the power source.

4. The double balanced modulator of claim 3 further comprising a second double balanced differential amplifier interconnected to the second pair of preamplifiers.

5. The double balanced modulator of claim 4 further comprising a variable resistor interconnected between a pair of bases of one of the pair of preamplifiers.

* * * * *